(12) United States Patent
Galvagni et al.

(10) Patent No.: US 6,459,561 B1
(45) Date of Patent: Oct. 1, 2002

(54) LOW INDUCTANCE GRID ARRAY CAPACITOR

(75) Inventors: John Galvagni; Andrew Ritter, both of Surfside; Gheorghe Korony, Myrtle Beach; Sonja Brown, Surfside Beach, all of SC (US)

(73) Assignee: AVX Corporation, Myrtle Beach, SC (US)

( * ) Notice: Subject to any disclaimer, the term of this patent is extended or adjusted under 35 U.S.C. 154(b) by 0 days.

(21) Appl. No.: 09/879,803

(22) Filed: Jun. 12, 2001

(51) Int. Cl.$^7$ .............................................. H01G 4/228
(52) U.S. Cl. ............................... 361/306.3; 361/306.1; 361/764; 361/763; 361/309
(58) Field of Search .................................. 361/303, 304, 361/305, 306.1, 306.3, 309, 311–313, 312.2, 328, 329, 764, 765, 766

(56) References Cited

U.S. PATENT DOCUMENTS

| | | | |
|---|---|---|---|
| 4,409,608 A | | 10/1983 | Yoder |
| 4,831,494 A | * | 5/1989 | Arnold et al. ........... 361/306.1 |
| 4,866,567 A | | 9/1989 | Crafts et al. |
| 5,583,359 A | | 12/1996 | Ng et al. |
| 5,717,245 A | | 2/1998 | Pedder |
| 5,774,326 A | * | 6/1998 | McConnelee et al. ... 361/306.1 |
| 5,821,827 A | | 10/1998 | Mohwinkel et al. |
| 5,880,921 A | | 3/1999 | Tham et al. |
| 6,072,687 A | * | 6/2000 | Naito et al. .................. 361/303 |
| 6,114,756 A | | 9/2000 | Kinsman |
| 6,243,253 B1 | * | 6/2001 | DuPre et al. ............. 361/301.4 |
| 6,292,350 B1 | * | 9/2001 | Naito et al. .................. 361/303 |

OTHER PUBLICATIONS

*Controlling Capacitor Parasitics for High Frequency Decoupling*, by George Korony, Andrew Ritter, Carlos Gonzalez–Titman, Joseph Hock, John Galvagni and Robert Heistand II; presented IMAPS 2001, the 34$^{th}$ International Symposium on Microelectronics, Oct. 9–11, 2001, Baltimore, Maryland.

(List continued on next page.)

*Primary Examiner*—Anthony Dinkins
(74) *Attorney, Agent, or Firm*—Dority & Manning

(57) ABSTRACT

An improved low inductance termination scheme is disclosed for grid array capacitors. The enhanced termination scheme provides for shorter termination length and leaves the sides of a capacitive element free from any structure. The area typically taken up by solder lands is reduced, facilitating much closer chip spacing on a circuit board. The arrangement generally includes interleaved dielectric and electrode layers in an interdigitated configuration. Vias are drilled through tabs extending from selected of the electrode layers, and then filled with suitable conductive material. Solder balls may be applied directly to this conductive material, providing a ball grid array (BGA) packaged chip ready to mount on an IC and reflow. Composition of such solder balls is easily varied to comply with specific firing conditions. Such capacitor chips are also compatible with land grid array (LGA) packaging techniques. The subject interdigitated electrode design may be utilized to form a single multilayer capacitor or multiple discrete capacitors. Such a capacitor array may be formed by retaining the external configuration and internally subdividing the electrodes. The resulting low cost, low inductance capacitor is ideal for many high frequency applications requiring decoupling capacitors.

23 Claims, 5 Drawing Sheets

OTHER PUBLICATIONS

*Distributed SPICE Circuit Model for Ceramic Capacitors*, by Larry Smith and David Hockanson; presented Electronic Components and Technology Conference, May 29–Jun. 1, 2001.

*Technical Information: A Passive Component Approach to Faster, Better and Cheaper*, by Chris Reynolds; posted on corporate website www.avxcorp.com/TechInfo_catlisting.asp. , Mar., 2000, Myrtle Beach, SC.

*Technical Information: Interconnect Schemes for Low Inductance Ceramic Capacitors*, by Jeff Cain, Ph.D.; posted on corporate website www.avxcorp.com/TechInfo_catlisting.asp., Apr., 1999, Myrtle Beach, SC.

*Technical Information: The need for Low Inductance Capacitors*, by John Galvagni, Sara Randall, Paul Roughan and Allen Templeton; posted on corporate website www.avxcorp.com/TechInfo_catlisting.asp., Jul. 1994, Myrtle Beach, SC.

*Technical Information: Low Inductance Capacitors for Digital Circuits*, by John Galvagni; posted on corporate website www.avxcorp.com/TechInfo_catlisting.asp., Mar., 1992, Myrtle Beach, CA.

* cited by examiner

LOW INDUCTANCE GRID ARRAY CAPACITOR

BACKGROUND OF THE INVENTION

The present invention generally concerns control of equivalent series inductance (ESL) of decoupling capacitors, and more particularly, concerns low inductance terminations for a grid array capacitor. The subject invention concerns a capacitor array that can be utilized in either ball grid array or land grid array configurations and that provides a lower ESL and thus a much more efficient capacitor device.

Integrated circuits (ICs) have been implemented for some time, but many specific features of these ICs affect the design criteria for electronic components and corresponding procedures for mounting such components. With increased functionality of integrated circuit components, the design of electronic components must become increasingly more efficient. The miniaturization of electronic components is a continuing trend in the electronics industry, and it is of particular importance to design parts that are sufficiently small, yet simultaneously characterized by high operating quality. Components are desired that are small in size and that have reliable performance characteristics, yet can be manufactured at relatively low costs.

Component miniaturization enables higher density mounting on circuit boards or other foundations. Thus the spacing between components is also a limiting factor in present integrated circuit designs. Since spacing is such a critical design characteristic, the size and location of termination means or elements for IC components is also a significant design characteristic.

One specific electronic component that has been used in IC applications is the decoupling capacitor. Decoupling capacitors are often used to manage noise problems that occur in circuit applications. They provide stable, local charge sources required to switch and refresh the logic gates used in present digital circuits. A dramatic increase in the speed and packing density of integrated circuits requires advancements in decoupling capacitor technology. When high-capacitance decoupling capacitors are subjected to the high frequencies of many present applications, performance characteristics become increasingly more important. One way to achieve improved performance is by lowering the inductance of the device. Thus, it is ideal that such capacitive structures provide low equivalent series inductance (ESL) in order to maintain circuit efficiency.

Several design aspects have been implemented that reduce the self and mutual inductance of decoupling capacitors. Reducing the current path will lower self inductance. Since the current often has to travel the entire length of the capacitor, termination on the longer ends of the structure will reduce the current path. If the current in adjacent capacitor electrodes flows in opposite directions it will reduce the mutual inductance in a capacitor. Multiple terminations as utilized in interdigitated capacitor technology lowers the inductance value.

Another approach to lowering the ESL of a decoupling capacitor is to minimize interconnect induction that results from termination configurations and mounting systems. Typical termination schemes incorporate long traces to the capacitor electrode pads. Such a connection is characterized by high inductance and often prohibits very close spacing between components. Thus, a more efficient termination is desired that has low ESL and that facilitates high component density for integrated circuits. It is also ideal to provide such an efficient termination scheme without decreasing the volumetric efficiency of the component.

Yet another contribution to lowering the ESL of a decoupling capacitor lies in reducing the current path between a ground plane or power plane in an integrated circuit to the electrode plates in a multilayer capacitor configuration. Typical multilayer capacitor designs require relatively thick cover layers on both top and bottom of such a multilayer configuration. These protective layers ideally provide sufficient bulk to withstand the stress of typical glass/metal frit that must be fired to a capacitor body. This typical need for protective outer layers hinders potential reduction of loop inductance.

In the context of decoupling capacitors, it is often ideal to incorporate other design characteristics based on specific applications. Customers of capacitor manufacturers often specify such choices, including capacitor packaging configuration and termination composition. In particular, it is convenient to have capacitors that can encompass either land grid array or ball grid array designs. It is ideal to incorporate such options into a capacitor design in a cost-effective and convenient manner.

While examples of various aspects and alternative embodiments are known in the field of multilayer decoupling capacitors, no one design is known that generally encompasses all of the above-referenced preferred capacitor characteristics.

U.S. Pat. No. 6,064,108 shows an example of a multilayer capacitor that incorporates an arrangement of "interdigitated" capacitor plates. Such '108 patent represents an exemplary electrode configuration that enables reliable high-capacitance multilayer devices.

U.S. Pat. No. 5,661,450 discloses resistor arrays with low inductance termination schemes. Such arrays include conductive vias through a substrate with attached solder balls. This configuration is exemplary of a design that achieves low inductance connections for an integrated circuit environment.

U.S. Pat. Nos. 5,666,272 and 5,892,245 disclose examples of ball grid array (BGA) packages that facilitate increased component density on circuit boards.

U.S. Pat. No. 6,097,609 shows an exemplary packaging assembly that is compatible with both ball grid array (BGA) and land grid array (LGA) design configurations.

U.S. Pat. No. 5,880,925 discloses an exemplary multilayer capacitor with an interdigitated arrangement of lead structures.

Japanese Pat. Nos. 1-37756 and 7-37775 reference capacitor arrays capable of high density component packaging.

Additional patents provide varied examples of capacitor designs, as follows.

| U.S. Pat. No.: | INVENTOR: | ISSUE DATE: | TITLE: |
|---|---|---|---|
| 5,973,391 | Bischoff et al. | 10/26/1999 | INTERPOSER WITH EMBEDDED CIRCUITRY AND METHOD FOR USING THE SAME TO PACKAGE MICROELECTRONIC UNITS |
| 5,905,633 | Shim et al. | 05/18/1999 | BALL GRID ARRAY SEMICONDUCTOR PACKAGE USING A METAL CARRIER RING AS A HEAT SPREADER |
| 5,893,724 | Chakravorty et al. | 04/13/1999 | METHOD FOR FORMING A HIGHLY RELIABLE AND PLANAR BALL GRID ARRAY PACKAGE |
| 5,892,290 | Chakravorty et al. | 04/06/1999 | HIGHLY RELIABLE AND PLANAR BALL GRID ARRAY PACKAGE |
| 5,872,399 | Lee | 02/16/1999 | SOLDER BALL LAND METAL STRUCTURE OF BALL GRID SEMICONDUCTOR PACKAGE |
| 5,864,470 | Shim et al. | 01/26/1999 | FLEXIBLE CIRCUIT BOARD FOR BALL GRID ARRAY SEMICONDUCTOR PACKAGE |
| 5,855,323 | Yost et al. | 01/05/1999 | METHOD AND APPARATUS FOR JETTING, MANUFACTURING AND ATTACHING UNIFORM SOLDER BALLS |
| 5,787,580 | Woo | 08/04/1998 | METHOD FOR MAKING RADIO-FREQUENCY MODULE BY BALL GRID ARRAY PACKAGE |
| 5,724,728 | Bond et al. | 03/10/1998 | METHOD OF MOUNTING AN INTEGRATED CIRCUIT TO A MOUNTING SURFACE |
| 5,642,265 | Bond et al. | 06/24/1997 | BALL GRID ARRAY PACKAGE WITH DETACHABLE MODULE |
| 5,641,113 | Somaki et al. | 06/24/1997 | METHOD FOR FABRICATING AN ELECTRONIC DEVICE HAVING SOLDER JOINTS |
| 5,637,832 | Danner | 06/10/1997 | SOLDER BALL ARRAY AND METHOD OF PREPARATION |
| 5,594,275 | Kwon et al. | 01/14/1997 | J-LEADED SEMICONDUCTOR PACKAGE HAVING A PLURALITY OF STACKED BALL GRID ARRAY PACKAGES |
| 5,519,580 | Natarajan et al. | 05/21/1996 | METHOD OF CONTROLLING SOLDER BALL SIZE OF BGA IC COMPONENTS |
| 5,516,030 | Denton | 05/14/1996 | METHOD AND APPARATUS FOR ASSEMBLING BALL GRID ARRAY COMPONENTS ON PRINTED CIRCUIT BOARDS BY REFLOWING BEFORE PLACEMENT |
| 5,504,277 | Danner | 04/02/1996 | SOLDER BALL ARRAY |
| 5,442,852 | Danner | 08/22/1995 | METHOD OF FABRICATING SOLDER BALL ARRAY |

The disclosures of all of the foregoing United States patents are hereby fully incorporated into this application by reference thereto.

SUMMARY OF THE INVENTION

In view of the discussed drawbacks and other shortcomings encountered in the prior art, and recognized and addressed by the present invention, improved low inductance capacitor technology has been developed. Thus, broadly speaking, a general object of the present invention is improved termination schemes for multilayer capacitor arrays.

It is another general object of the present invention to provide a low inductance capacitor array that facilitates closer component spacing in an integrated circuit environment.

It is a principal object of the present invention to provide capacitor array technology that is compatible with both ball grid array and land grid array packaging configurations.

It is another principal object of the present invention to provide a multilayer capacitor array with lowered equivalent series inductance (ESL).

It is another object of the present invention to provide capacitors with interdigitated electrode configurations that may define a single capacitor or a capacitor array.

It is a further object of the present invention to provide improved termination schemes for multilayer capacitor arrays without significant decrease in the volumetric efficiency of such capacitor arrays.

Additional objects and advantages of the invention are set forth in, or will be apparent to those of ordinary skill in the art from, the detailed description herein. Also, it should be further appreciated that modifications and variations to the specifically illustrated, referenced and discussed features hereof may be practiced in various embodiments and uses of this invention without departing from the spirit and scope thereof, by virtue of present reference thereto. Such variations may include, but are not limited to, substitution of equivalent means and features for those illustrated, referenced or discussed, and the functional, operational or positional reversal of various parts, features or the like.

Still further, it is to be understood that different embodiments, as well as different presently preferred embodiments, of this invention may include various combinations or configurations of presently disclosed features or elements, or their equivalents (including combinations of features or parts or configurations thereof not expressly shown in the figures or stated in the detailed description). One exemplary such embodiment of the present subject matter relates to a multilayer capacitor. Such capacitive element may comprise a body of dielectric material, a plurality of electrode layers and electrode tabs, a plurality of vias and a conductive material for termination formation.

More preferably, such exemplary dielectric layers and electrode layers are interleaved to form a multilayer configuration. Electrode tabs may extend from certain electrode layers in a predefined manner such that vias are formed through a combination of selected electrode tabs. A conductive material may then preferably fill the conductive vias to form multiple capacitor terminations.

Another present exemplary embodiment of the present subject matter concerns such a multilayer capacitor as described above for use as a capacitor array. Such capacitor array may preferably be configured for use with either ball grid array (BGA) or land grid array (LGA) packaging techniques. More preferably, such an array configuration may comprise a multilayer arrangement of dielectric and electrode layers, electrode tabs extending from selected electrode layers, and conductive vias defined through predefined electrode tabs. The vias may then be preferably filled with a conductive material, forming a columnar termination to which solder balls may be attached.

Still further exemplary embodiments of the present subject matter involve various combinations of selected of the foregoing features, wherein selected of the exemplary electrode layers are subdivided to provide multiple discrete capacitive elements. This optional feature in the disclosed embodiments facilitates the versatile design choice to create either a single multilayer capacitor or a multilayer capacitor array.

Additional embodiments of the subject invention, not necessarily expressed in this summarized section, may include and incorporate various combinations of aspects of features or parts referenced in the summarized objectives above, and/or other features, parts, or elements as otherwise discussed in this application.

Those of ordinary skill in the art will better appreciate the features and aspects of such embodiments, and others, upon review of the remainder of the specification.

BRIEF DESCRIPTION OF THE DRAWINGS

A full and enabling disclosure of the present subject matter, including the best mode thereof, directed to one of ordinary skill in the art, is set forth in the specification, which makes reference to the appended figures, in which.

Figure 1:
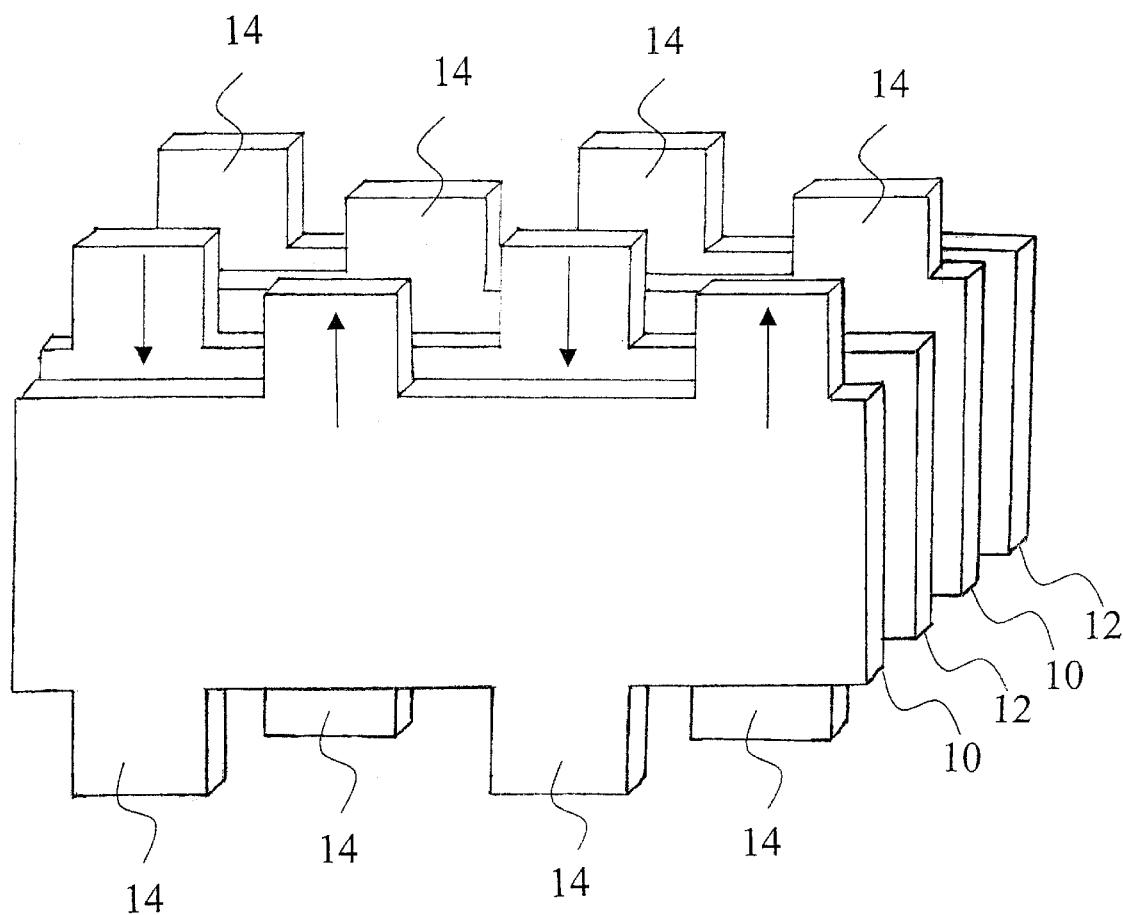
FIG. 1 illustrates a generally top and partially perspective view of an exemplary electrode layer configuration (partially exploded) for use in a multilayer interdigitated capacitor in accordance with present subject matter.

Repeat use of reference characters throughout the present specification and appended drawings is intended to represent same or analogous features or elements of the subject invention.

DETAILED DESCRIPTION OF THE DRAWINGS AND INVENTION

As referenced in the Summary of the Invention section supra, the present subject matter is particularly concerned with multilayer capacitors with improved termination schemes. Aspects of several exemplary configurations that are utilized in part in typical capacitor technology are represented in FIGS. 1, 4A, 4B and 5A. All such figures are discussed in the present specification in the context of the present subject matter. FIGS. 2, 3A, 3B, and 5B all represent improvements over conventional capacitor configurations, yielding exemplary embodiments of the present subject matter.

It should be noted that each of the exemplary embodiments should not insinuate limitations of the invention. Features illustrated or described as part of one embodiment may be used in combination with another embodiment to yield yet further embodiments. Additionally, certain features may be interchanged with similar devices or features though not expressly mentioned which perform the same or similar function(s).

Reference will now be made in detail to the presently preferred embodiments of the present subject matter. Referring to the drawings, FIG. 1 illustrates an exemplary configuration of a plurality of electrode layers 10 and 12 and of a plurality of electrode tabs 14 for use in a multilayer capacitor or capacitor array. Electrode layers 10 and 12 are arranged in parallel with tabs extending from the layers such that electrode tabs extending from alternating electrode layers are aligned in respective columns. Such exemplary configuration yields an interdigitated arrangement of electrode layers as potentially applicable for use in embodiments of the present subject matter.

The exemplary illustration of FIG. 1 depicts a total of four such electrode layers 10 and 12 with corresponding tabs 14, but typical arrangements as utilized in conjunction with the present subject matter may vary and may often contain many more electrode layers and respective tabs. Such feature provides the design option of creating capacitive elements with a large range of capacitance values (by choosing the number of electrodes).

The arrangement as depicted in FIG. 1 provides an electrode configuration with generally low equivalent series inductance (ESL). Both the self and mutual inductance of the element are generally lowered due to the exemplary interdigitated electrode configuration. Current flows in such exemplary capacitor plates are referenced by up arrows (unnumbered) and down arrows (unnumbered), where the up arrows display the direction of current flow in alternating electrode layers 10, and the down arrows display the direction of current flow in electrode layers 12 that are displaced between the defined alternating layers 10. Since the current does not have to travel the entire length of both electrodes to complete the circuit, self inductance of the device is lowered.

Adjacent layers in the exemplary arrangement of FIG. 1 may be thought of schematically as positive and negative plates. The electrode arrangement is such that the current flowing out of a positive plate 10 returns in the opposite direction along an adjacent negative plate 12. Such provision of current flows in opposing directions eliminates any mutual inductance created by adjacent current flow in the same direction.

Figure 2:
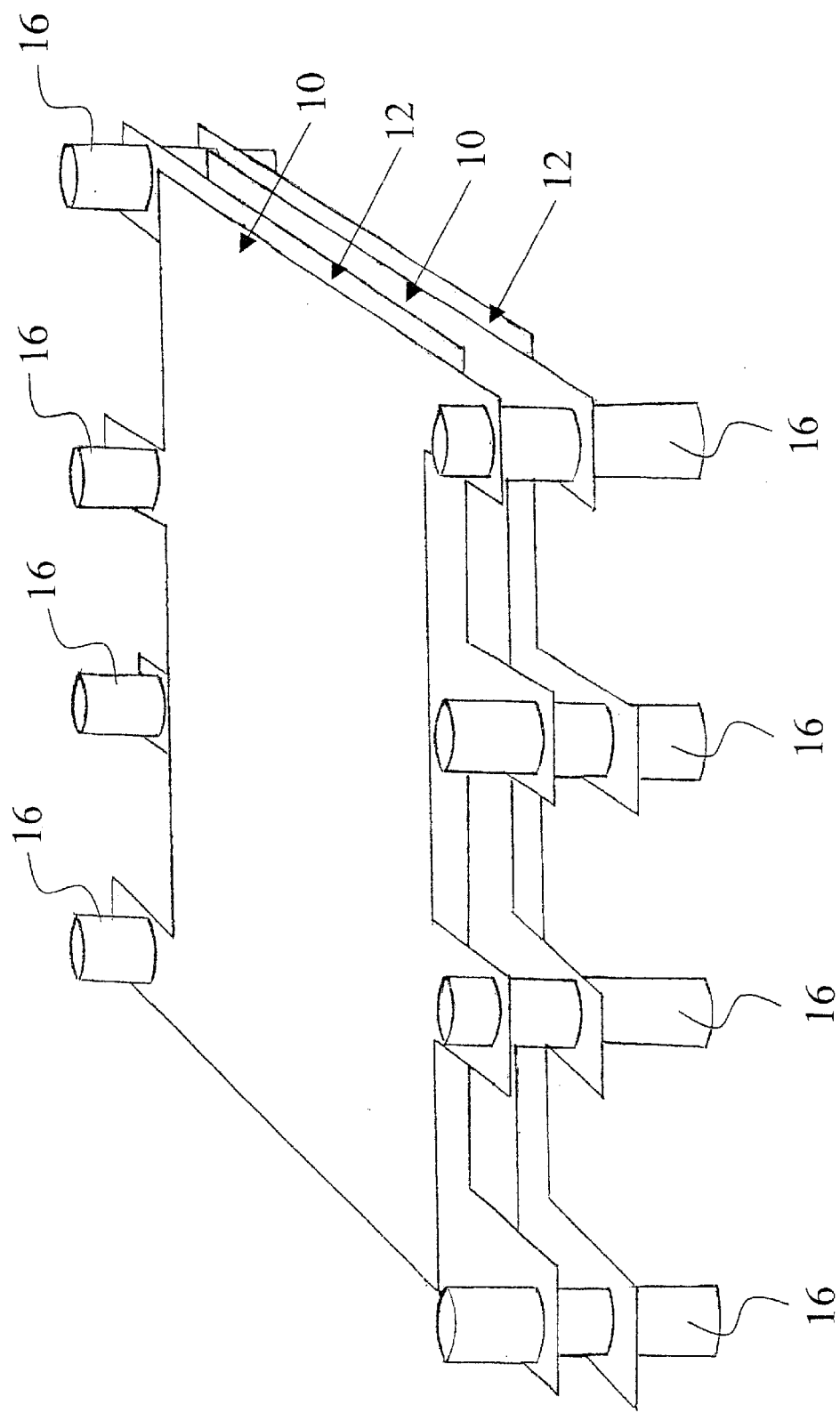
FIG. 2 illustrates a generally side view, with some top perspective, of an exemplary arrangement of electrode plates and corresponding electrode tabs with conductive vias in accordance with present subject matter.

FIG. 2 displays an exemplary interconnection of exemplary electrode layers 10 and 12 and conductive material 16 formed through tabs 14 extending from selected of the electrode layers. These elements disposed in a dielectric body comprise one exemplary embodiment of the present subject matter. By forming vias (e.g., by drilling or other appropriate means) through the parallel tabs 14 and filling them with a conductive material 16, a low inductance connection (or termination) is created. Such via configuration and potential mounting systems facilitate capacitive elements with an overall very low ESL.

It is ideal to form such vias and resultant electrical connections only through selected portions (i.e. the electrode tabs 14) of the electrode layers. Excessive via formation, especially in the main portion of the electrode layers, results in an element with poor volumetric capacitor efficiency. By placing the vias in an inactive margin of the electrode layers, volumetric efficiency of such capacitor arrays is preferably not reduced.

In the best mode (or preferred embodiments) of the present subject matter, the electrode layers 10 and 12 may typically be comprised of platinum, nickel, a palladium-silver alloy, or other suitable elements or combinations of elements. The conductive material 16 used to form the electrical connection to the capacitor plates may typically be comprised of silver, nickel or other suitable conductive material.

Figure 3A:
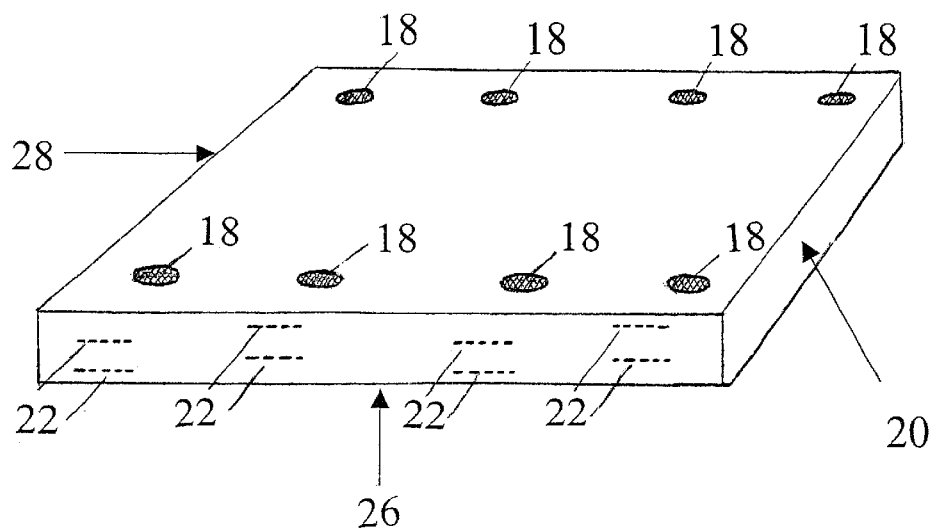
FIG. 3A illustrates a generally front view, with some top perspective, of an exemplary capacitor embodiment in accordance with the present disclosure with vias formed (e.g., drilled) through predetermined positions of such a capacitor body.
Figure 3B:
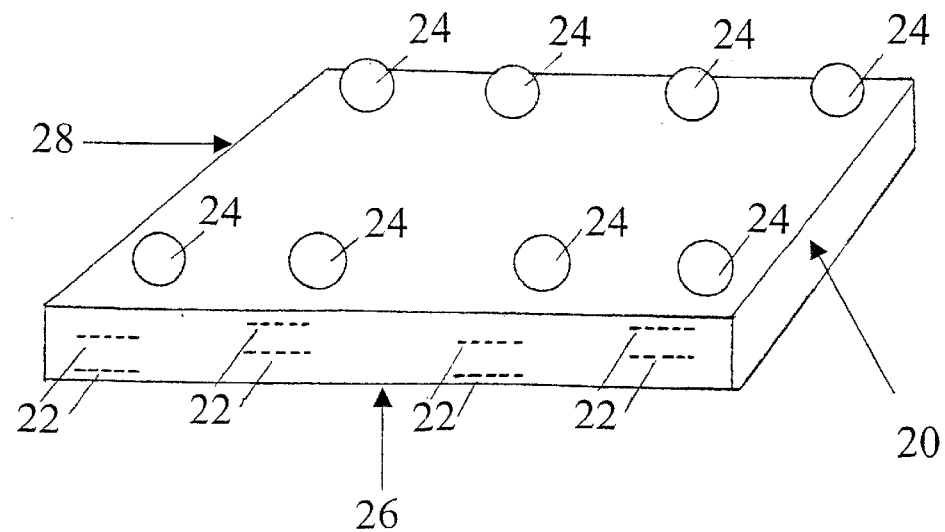
FIG. 3B illustrates a generally front view, with some top perspective, of an exemplary capacitor embodiment in accordance with the present disclosure with solder preforms attached to conductive vias formed in such a capacitor body.

FIGS. 3A and 3B illustrate exemplary embodiments of the present subject matter, displaying capacitor chips 20 characterized by interleaved dielectric and electrode layers. A dielectric material typically used may be barium titanate or other suitable dielectric. Suitable dielectrics are often utilized such that maximum capacitance is delivered at temperatures above room temperature (often around 60° C.).

The electrode tabs 14 preferably extend towards the longer sides 26 of the chip body in accordance with the present subject matter. Known interdigitated electrode tabs often completely extend through a chip body 20 so that they are exposed on the longer side 26 of the capacitive element. Potential exposed portions of the electrode tabs are denoted by dashed lines 22, and may be utilized to implement alternative termination schemes. Presently preferred embodiments of the present subject matter do not require such exposed portions 22 of electrode tabs 14. This variation does not affect the improved termination scheme as disclosed in this specification, since the terminations are ultimately provided by conductive material 16 and solder elements 24.

The present termination scheme such as that. represented FIG. 2 allows for an arrangement that advantageously leaves the sides of chip 20 free of any structure. Besides lowering the ESL of the resulting chip in accordance with the present subject matter, such arrangement advantageously permits much closer spacing between components on a circuit board. Since termination is provided directly, the area otherwise usually taken up by solder lands is also reduced. Elimination of the solder lands also yields lower termination inductance.

It is also preferred that the vias 18 and subsequent termination scheme formed along the capacitor chip 20 are along the longer side 26 of the capacitor chip. As opposed to terminating along the shorter side 28 of chip 20, the configuration of the present subject matter provides a shorter distance for the current path, creating lower ESL. Typical dimensions for such shorter sides 28 and longer sides 26, respectively, of chip 20 may be about 60×120 mils (thousandths of an inch) or about 50×80 mils. In some embodiments of the present subject matter, different dimensions may be practiced, as will be readily understood by those of ordinary skill in the art.

Once vias 18 are formed (for example, such as by drilling) through the exemplary capacitor body and filled with conductive termination material 16, solder balls 24 may be attached to form a ball grid array package. Solder balls 24 may typically have a diameter of about 10–15 mils (though other sizes may be practiced, as understood in the art). Additional implementation of such ball grid array packaging techniques may incorporate the distribution of solder preforms over an entire surface of a capacitor chip 20. Solder balls 24 may be distributed over the top surface, bottom surface, or both surfaces of the capacitive element in accordance with present termination and mounting technologies.

Once the capacitive element of FIG. 3B is formed (and assembled with solder balls 24), chip 20 is mountable without the use of additional solder. Since fine solder traces are often difficult to form, it is quite advantageous that with such a device, one can simply place chip 20 onto a board and then perform solder reflow to complete assembly. It is preferred to provide a variety of solder ball compositions to meet varied customer needs and preferences. Such design flexibility allows for low-fire or high-fire solder reflow operations.

The chip design of FIG. 3A is not only compatible with BGA (ball grid array) packaging as illustrated in FIG. 3B, but is also compatible with LGA (land grid array) packaging. The LGA configuration may often be more difficult to implement with small components and high component density, but product flexibility is still desired.

Figure 4A:
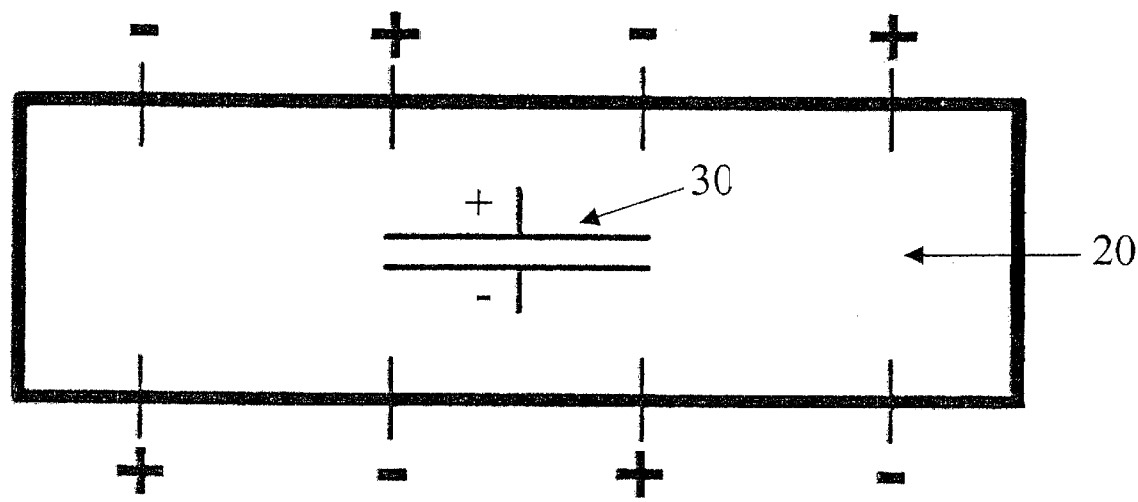
FIG. 4A illustrates a schematic circuit representation of an exemplary capacitor with multiple terminations in accordance with present subject matter.
Figure 4B:
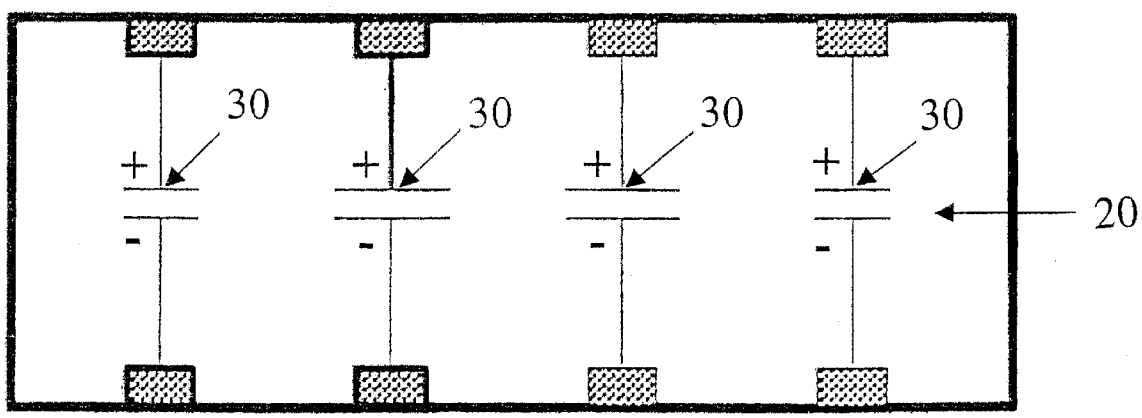
FIG. 4B illustrates a schematic circuit representation of an exemplary capacitor array, comprised of multiple discrete capacitors in a single component in accordance with present subject matter.

Another design option in implementing various embodiments of the present subject matter is whether or not single or multiple capacitors 30 are desired. FIGS. 4A and 4B represent exemplary schematics of such two options, respectively.

As referenced in the above exemplary embodiments, electrode layers 10 and 12 may provide for a single interdigitated capacitor (IDC) 30 with multiple terminations, such as the exemplary embodiment represented in present FIG. 4A. However, such arrangement may be modified, in accordance with broader aspects of the present subject matter, so as to obtain exemplary embodiments such as the element modeled in present FIG. 4B. In accordance with the present disclosure, the earlier referenced external chip configuration is maintained while the electrodes 10 and 12 are internally subdivided. FIG. 4B represents that such modifications yield multiple discrete capacitors 30, or a capacitor array. Thus, the termination scheme of the present subject matter may be used with IDC's or with integrated passive components (IPC's).

Figure 5A:
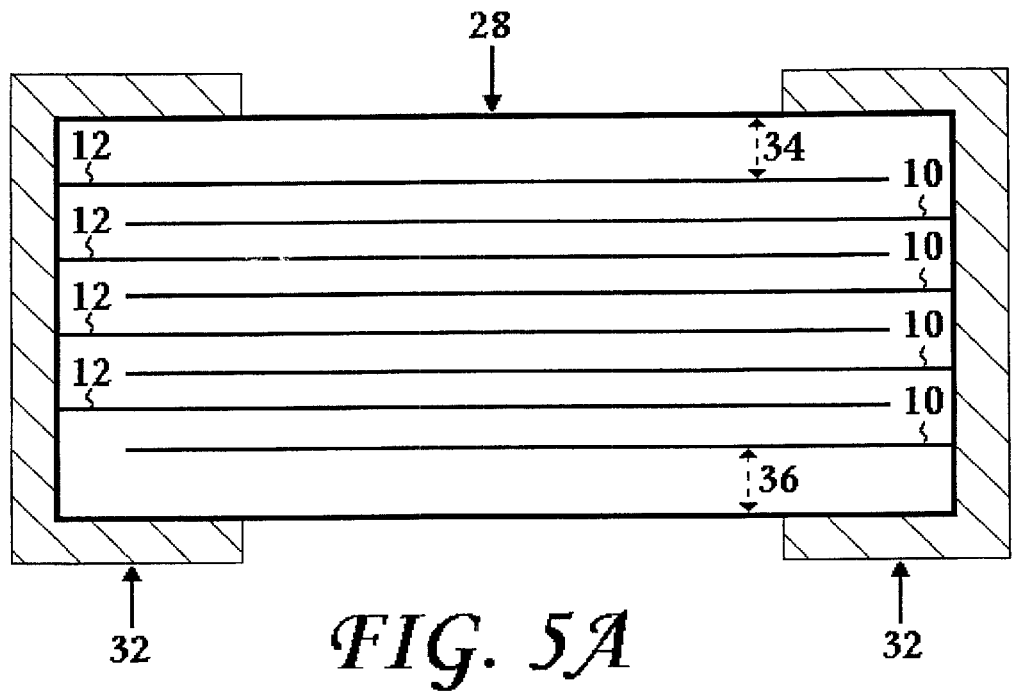
FIG. 5A illustrates a generally side view of an exemplary known configuration of and termination scheme for use in a multilayer capacitor design.

A generally side view of a typical multilayer capacitor termination scheme is displayed in FIG. 5A. Alternating electrode layers 10 and 12 are disposed in chip body 20 and may preferably be exposed on shorter sides 28 of chip 20. In such a typical capacitor configuration as that illustrated in FIG. 5A, cover layers of a minimum thickness are required in order to withstand certain stresses caused in the manufacturing process. A minimum top layer thickness 34 and a minimum bottom layer thickness 36 are thus provided to withstand the stress of a usual glass/metal frit that must be fired onto the chip 20. Such typical exemplary process of diffusing a glass matrix into a ceramic chip body are assumed to be understood by those in the art of multilayer chip capacitor production. Exemplary terminations 28 which usually provide more area to solder a chip 20 to a circuit board also supply additional width to the top and bottom of chip 20.

The existence of such top layer 34 and bottom layer 36 combined with the termination scheme of FIG. 5A add more equivalent series inductance to such a capacitor device, specifically by increasing the loop path inductance. Embodiments in accordance with present subject matter, such as that displayed in FIG. 5B allow for a significant reduction of such top layer 34 and bottom layer 36.

Figure 5B:
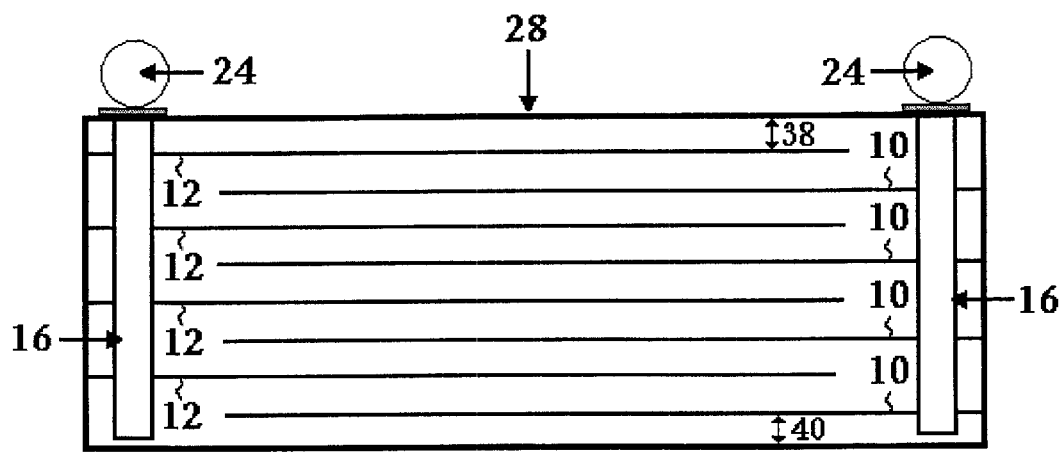
FIG. 5B illustrates a generally side view of an exemplary configuration of and termination scheme for multilayer capacitor embodiments in accordance with present subject matter.

Referring now to FIG. 5B, a termination scheme in accordance with presently disclosed technology provides a multilayer capacitor configuration with exemplary conductive material 16 and solder elements 24. By eliminating typical wrap-around terminations 32, the removal of bulky top 34 and bottom 36 dielectric layers is afforded. New exemplary top distance 38 between top electrode layer and top surface of chip 20 and exemplary bottom distance 40 between bottom electrode layer and bottom surface of chip 20 are potentially much shorter than exemplary top distance 34 and bottom distance 36 of FIG. 5A. Once again, this potential difference would yield a capacitor configuration with much. smaller ESL.

The various embodiments of the present subject matter as described in the above specification include many flexible design options. These may include selection of the grid array packaging, designation of the number of discrete capacitors 30, and selection of a preference for the solder ball 24 composition. An embodiment characterized by any combination of such choices may still be combined with the low inductance termination scheme of the present subject matter. Any of such combinations yield low inductance capacitors at relatively low cost for use in any high frequency application requiring decoupling capacitors.

While the present subject matter has been described in detail with respect to specific embodiments thereof, it will be appreciated that those skilled in the art, upon attaining an understanding of the foregoing may readily conceive of alterations to, variations of, and equivalents to such embodiments. Accordingly, the scope of the present disclosure is by way of example rather than by way of limitation, and the subject disclosure does not preclude inclusion of such modifications, variations, and/or additions to the present subject matter as would be readily apparent to one of ordinary skill in the art, the scope of the present subject matter being set forth in the appended claims.

What is claimed is:

1. A multilayer capacitor, comprising:
    a body of dielectric material;
    a plurality of electrode layers disposed in said body;
    a plurality of electrode tabs extending from selected of said electrode layers;
    a plurality of vias, said vias formed through a selected predetermined volume of said dielectric body and through selected of said tabs; and
    a conductive material inserted into selected of said vias, generally filling selected said vias and providing for an electrical connection to selected of said electrode tabs.

2. A multilayer capacitor as in claim 1, wherein said plurality of electrode tabs are arranged such that selected electrode tabs extending from alternating electrode layers are vertically aligned, forming an interdigitated capacitor element.

3. A multilayer capacitor as in claim 1, wherein each of said plurality of vias is formed in selected of said electrode tabs such that each of said vias never extends through electrode tabs extending from two adjacent electrode layers.

4. A multilayer capacitor as in claim 1, wherein said body of dielectric material is characterized by a top surface and a bottom surface, and wherein said electrode layers are disposed in said dielectric body such that each said electrode layer is oriented parallel with said top surface and said bottom surface of said dielectric body.

5. A multilayer capacitor as in claim 4, wherein said conductive material is exposed on selected of said top and bottom surfaces of said dielectric body.

6. A multilayer capacitor as in claim 5, further including solder balls attached to said exposed conductive material on selected of said top and bottom surfaces of said dielectric body, forming a ball grid array capacitor.

7. A multilayer capacitor as in claim 6, further including solder balls attached to selected of said top and bottom surfaces of said dielectric body to form a distributed predetermined arrangement of solder balls over selected of said top and bottom surfaces.

8. A multilayer capacitor as in claim 5, wherein said solder balls may be composed of a variety of suitably conductive materials with a range of different melting points, thereby facilitating varied firing conditions.

9. A multilayer capacitor as in claim 1, wherein selected of said electrode layers are subdivided to provide a capacitor array of multiple discrete capacitive elements.

10. A multilayer capacitor as in claim 1, wherein said capacitor is compatible with land grid array mounting procedures for mounting said capacitor to a substrate or printed circuit board.

11. A multilayer capacitor for use in either ball grid array (BGA) or land grid array (LGA) configurations, comprising:
    a plurality of electrode layers, each of said electrode layers characterized by a first and second side;
    a plurality of dielectric layers wherein selected of said dielectric layers are arranged on both first and second sides of each of said electrode layers, forming a multilayer arrangement of alternating dielectric and electrode layers wherein said multilayer arrangement is characterized by a topmost layer and a bottommost layer;

a plurality of electrode tabs extending from selected of said electrode layers;

a plurality of vias defined through selected of said electrode tabs, forming hollow columns within said multilayer arrangement; and a conductive material inserted into selected of said vias, wherein said conductive material is exposed on selected of said topmost and bottommost layers of said multilayer arrangement and wherein said conductive material provides an electrical connection to selected of said electrode tabs.

12. A multilayer capacitor as in claim 11, wherein said plurality of electrode tabs are arranged such that selected electrode tabs extending from alternating electrode layers are vertically aligned, forming an interdigitated capacitor element.

13. A multilayer capacitor as in claim 11, wherein each of said plurality of vias is formed in selected of said electrode tabs such that each of said vias never extends through electrode tabs extending from two adjacent electrode layers.

14. A multilayer capacitor as in claim 11, further including solder preforms attached to said conductive material exposed on selected of said topmost and bottommost layers of said multilayer arrangement.

15. A multilayer capacitor as in claim 14, wherein said solder preforms may be composed of a variety of suitably conductive materials with a range of different melting points, thereby facilitating varied firing conditions.

16. A multilayer capacitor as in claim 11, wherein selected of said electrode layers are subdivided to provide a capacitor array of multiple discrete capacitive elements.

17. A multilayer capacitor as in claim 11, wherein the thickness of said topmost layer and said bottommost layer may be significantly decreased relative to known multilayer capacitor configurations.

18. A multilayer capacitor array with low inductance terminations, comprising:

a plurality of dielectric layers;

a plurality of electrode layers, interleaved with selected of said dielectric layers to form a multilayered arrangement, said multilayered arrangement having a defined top surface and a defined bottom surface;

a plurality of electrode tabs extending from selected of said electrode layers;

a plurality of vias, said vias being drilled through selected predetermined locations in said layered capacitor arrangement, and each of said vias drilled through at least selected one of said electrode tabs;

a conductive material inserted into selected of said vias, generally filling selected said vias and providing for an electrical connection to selected of said corresponding electrode tabs, said conductive material forming conductive columns wherein selected ends of said conductive columns are exposed on selected of said top surface and said bottom surface of said multilayered arrangement; and a plurality of solder balls attached to selected of said exposed ends of said conductive columns on one of either said top surface or said bottom surface of said layered capacitor arrangement.

19. A multilayer capacitor array as in claim 18, wherein said plurality of electrode tabs are arranged such that selected electrode tabs extending from alternating electrode layers are vertically aligned, forming an interdigitated capacitor element.

20. A multilayer capacitor array as in claim 18, wherein each of said plurality of vias is formed in selected of said electrode tabs such that each of said vias never extends through electrode tabs extending from two adjacent electrode layers.

21. A multilayer capacitor as in claim 18, wherein said plurality of solder balls may be composed of a variety of suitably conductive materials with a range of different melting points, thereby facilitating varied firing conditions.

22. A multilayer capacitor array as in claim 18, wherein selected of said electrode layers are subdivided to provide multiple discrete capacitive elements.

23. A multilayer capacitor array as in claim 21, further including solder balls attached to selected of said top and bottom surfaces of said dielectric body to form a predetermined distributed arrangement of solder balls over selected of said top and bottom surfaces.

* * * * *